US010031181B1

(12) United States Patent
Solt

(10) Patent No.: US 10,031,181 B1
(45) Date of Patent: Jul. 24, 2018

(54) INTEGRATED CIRCUIT PACKAGE RECEIVING TEST PATTERN AND CORRESPONDING SIGNATURE PATTERN

(71) Applicant: Marvell Israel (M.I.S.L.) Ltd., Yokneam (IL)

(72) Inventor: Yosef Solt, Atzmon-Segev (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 0 days.

(21) Appl. No.: 15/185,367

(22) Filed: Jun. 17, 2016

Related U.S. Application Data

(60) Provisional application No. 62/181,296, filed on Jun. 18, 2015.

(51) Int. Cl.
*G11C 29/56* (2006.01)
*G11C 29/44* (2006.01)
*G01R 31/317* (2006.01)
*G01R 31/3187* (2006.01)
*G01R 31/3193* (2006.01)
*G01R 31/3177* (2006.01)

(52) U.S. Cl.
CPC ... *G01R 31/31703* (2013.01); *G01R 31/3177* (2013.01); *G01R 31/3187* (2013.01); *G01R 31/3193* (2013.01); *G11C 29/44* (2013.01); *G11C 29/56* (2013.01); *G11C 2029/5602* (2013.01)

(58) Field of Classification Search
CPC .......... G01R 31/31703; G01R 31/3187; G01R 31/3193; G11C 2029/5602; G11C 29/56; G11C 29/44
See application file for complete search history.

(56) References Cited

U.S. PATENT DOCUMENTS

| | | | | | |
|---|---|---|---|---|---|
| 4,455,634 | A | * | 6/1984 | Efron | G06F 11/277 369/53.41 |
| 4,503,537 | A | * | 3/1985 | McAnney | G01R 31/318533 714/728 |
| 4,760,523 | A | * | 7/1988 | Yu | G06F 17/30985 |
| 5,144,230 | A | * | 9/1992 | Katoozi | G06F 11/184 324/537 |
| 5,572,712 | A | * | 11/1996 | Jamal | G06F 11/267 714/733 |
| 6,510,398 | B1 | * | 1/2003 | Kundu | G01B 31/318544 702/117 |
| 6,629,279 | B1 | * | 9/2003 | Narayan | G06F 11/2236 714/732 |

(Continued)

*Primary Examiner* — Joseph D Torres

(57) ABSTRACT

Aspects of the disclosure include an integrated circuit (IC) that includes a first input port configured to receive a test pattern, a second input port configured to receive a signature pattern, a set of interconnected circuit elements, and a comparison circuit. The signature pattern is indicative of an expected test output pattern in response to the test pattern. The set of interconnected circuit elements is configured to generate a test output pattern in response to the test pattern being passed through the set of interconnected circuit elements. The comparison circuit is configured to compare the test output pattern to the signature pattern, generate a test result based on a comparison result of the test output pattern to the signature pattern, and output the test result to the test apparatus.

9 Claims, 7 Drawing Sheets

(56) References Cited

U.S. PATENT DOCUMENTS

| | | | | |
|---|---|---|---|---|
| 7,412,672 B1 * | 8/2008 | Wang | ............... | G01R 31/31926 |
| | | | | 716/106 |
| 2003/0053358 A1 * | 3/2003 | Kundu | .................. | G11C 29/36 |
| | | | | 365/201 |
| 2003/0229886 A1 * | 12/2003 | Hasegawa | ...... | G01R 31/318563 |
| | | | | 717/115 |
| 2004/0193984 A1 * | 9/2004 | Soundron | .............. | G11C 29/40 |
| | | | | 714/733 |
| 2004/0246337 A1 * | 12/2004 | Hasegawa | ...... | G01R 31/318536 |
| | | | | 348/189 |
| 2007/0050693 A1 * | 3/2007 | Kiryu | ............ | G01R 31/318536 |
| | | | | 714/733 |
| 2007/0260950 A1 * | 11/2007 | Morrison | ....... | G01R 31/318536 |
| | | | | 714/726 |
| 2008/0077835 A1 * | 3/2008 | Khoche | ........... | G01R 31/31724 |
| | | | | 714/733 |
| 2009/0235132 A1 * | 9/2009 | Wang | ............ | G01R 31/318547 |
| | | | | 714/726 |
| 2010/0237891 A1 * | 9/2010 | Lin | ................... | G01R 31/2851 |
| | | | | 324/750.3 |
| 2011/0258499 A1 * | 10/2011 | Casarsa | ........... | G01R 31/31701 |
| | | | | 714/726 |

* cited by examiner

INTEGRATED CIRCUIT PACKAGE RECEIVING TEST PATTERN AND CORRESPONDING SIGNATURE PATTERN

INCORPORATION BY REFERENCE

This present disclosure claims the benefit of U.S. Provisional Application No. 62/181,296, "TESTER DRIVE SCANOUT TO CHIP" filed on Jun. 18, 2015, which is incorporated herein by reference in its entirety.

FIELD

This disclosure relates generally to automated functional testing of integrated circuits and multi-chip packages.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

During fabrication, integrated circuits are subjected to various electrical and functional tests. For example, one test technique is known as scan-based testing in which flip-flops of the integrated circuit are configured in a test mode to function as one or more shift registers (also referred to as "scan chains"). In the test mode, one or more test patterns of bits are shifted through the scan chain with a resulting pattern indicative of how the die operates in response to the test patterns being output at a terminus of the scan chain.

SUMMARY

Aspects of the disclosure provide an integrated circuit (IC) that includes a first input port configured to receive a test pattern from a test apparatus that is external to the IC package and a second input port configured to receive a signature pattern from the test apparatus. The signature pattern is indicative of an expected test output pattern in response to the test pattern. The IC also includes a set of interconnected circuit elements and a comparison circuit. The set of interconnected circuit elements is configured to receive the test pattern from the first input port, and generate a test output pattern in response to the first test pattern being passed through the set of interconnected circuit elements. The comparison circuit is configured to compare the first test output pattern to the first signature pattern, generate a test result based on a comparison result of the test output pattern to the signature pattern, and output the test result to the test apparatus.

In an embodiment, the comparison circuit is further configured to receive a mask pattern indicating a portion of the comparison result to be set as a pass result or a do-not-care result, and generate the comparison result of the test output pattern to the signature pattern consistent with the pass result or the do-not-care result indicated by the mask pattern.

In an embodiment, the first input port and the second input port are a same port. In an embodiment, the first input port and the second input port are different ports.

Aspects of the disclosure provide an integrated circuit (IC) package that includes a first die that having a first input port configured to receive a first test pattern from a test apparatus that is external to the IC package and a second input port configured to receive a first signature pattern from the test apparatus. The first signature pattern is indicative of a first expected test output pattern in response to the first test pattern. The IC package also includes a first set of interconnected circuit elements and a first comparison circuit. The first set of interconnected circuit elements is configured to receive the first test pattern from the first input port, and generate a first test output pattern in response to the first test pattern being passed through the first set of interconnected circuit elements. The first comparison circuit is configured to compare the first test output pattern to the first signature pattern, and generate a first die-level test result based on a comparison result of the first test output pattern to the first signature pattern.

In an embodiment, the IC package further includes a second die. The second die includes a third input port configured to receive a second test pattern from the test apparatus, a fourth input port configured to receive a second signature pattern from the test apparatus, a second set of interconnected circuit elements, and a second comparison circuit. The second signature pattern is indicative of a second expected test output pattern in response to the second test pattern. The second set of interconnected circuit elements is configured to receive the second test pattern from the third input port, and generate a second test output pattern in response to the second test pattern being passed through the second set of interconnected circuit elements. The second comparison circuit is configured to compare the second test output pattern to the second signature pattern, and generate a second die-level test result based on a comparison result of the second test output pattern to the second signature pattern.

In an embodiment, the first die and the second die have a same circuit configuration. In an embodiment, the first die and the second die have different circuit configurations.

In an embodiment, the IC package further includes a third die configured to receive the first die-level test result from the first die, receive the second die-level test result from the second die, generate a package-level test result based on the first die-level test result and the second die-level test result, and output the package-level test result to the test apparatus.

Aspects of the disclosure provide a method of testing an integrated circuit (IC). The method includes receiving a first test pattern from a test apparatus that is external to the IC; generating, by a first set of interconnected circuit elements of the IC, a first test output pattern in response to the first test pattern being passed through the first set of interconnected circuit elements; receiving a first signature pattern from the test apparatus; comparing at a first comparison circuit of the IC the first test output pattern to the first signature pattern; generating a test result based on the comparison of the first test output pattern to the first signature pattern; and outputting the test result to the test apparatus. The first signature pattern is indicative of a first expected test output pattern in response to the first test pattern.

In an embodiment, generating the test result includes generating an indication indicating whether the first test output pattern is consistent with the first signature pattern.

In an embodiment, the method further includes receiving a second test pattern from the test apparatus; generating, by a second set of interconnected circuit elements of the IC, a second test output pattern in response to the second test pattern being passed through the second set of interconnected circuit elements; receiving a second signature pattern from the test apparatus; and comparing at a second comparison circuit of the IC the second test output pattern to the second signature pattern. Generating the test result is further based on the comparison of the second test output pattern to the second signature pattern. The second signature pattern is indicative of a second expected test output pattern in response to the second test pattern.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
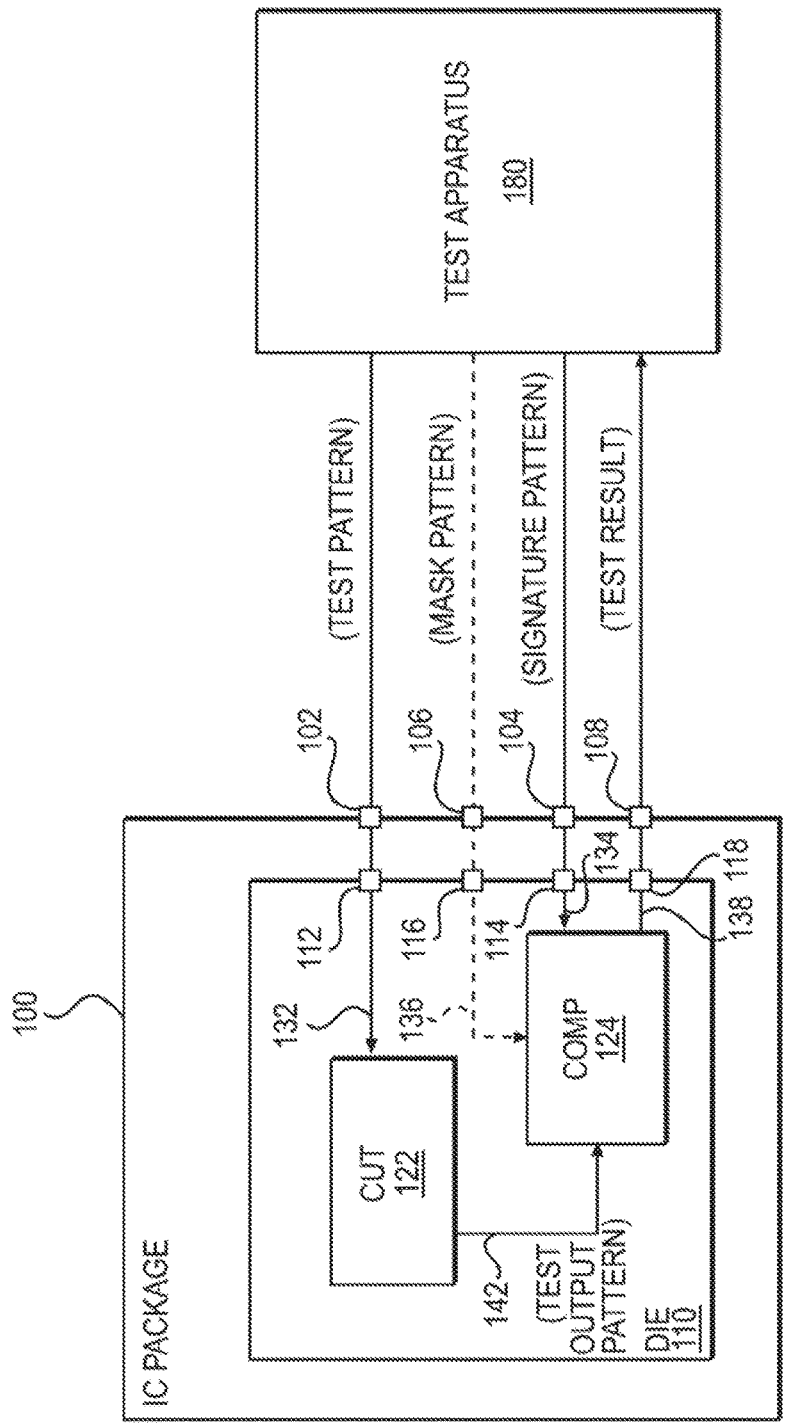
FIG. 1 shows a block diagram of an integrated circuit (IC) package example and a test apparatus example according to an embodiment of the disclosure.

FIG. 1 shows a block diagram of an integrated circuit (IC) package example 100 and a test apparatus example 180 according to an embodiment of the disclosure. The test apparatus 180 is external to the IC package 100 and is automated, in an embodiment. The IC package 100 includes a die 110 encapsulated therein. The IC package 100 also includes a plurality of connecting terminals 102, 104, 106, and 108 that are electrically coupled with the test apparatus 180. Each one of the connecting terminals 102, 104, 106, and 108 depicted in FIG. 1 represents one or more physical connecting pins (e.g., connecting pings, conductive pads, solder balls, or any suitable conductive members) on the IC package 100. Although the connecting terminals 102, 104, 106, and 108 are depicted as separate components in FIG. 1, in some examples, some of the connecting terminals 102, 104, 106, and 108 share the same physical connecting pins. In some examples, the connecting terminals 102, 104, 106, and 108 correspond to different physical pins.

The die 110 includes a plurality of input ports 112, 114, and 116 and an output port 118. The die 110 also includes a set of interconnected circuit elements 122 under test (also referred to by the abbreviation "CUT" in the drawings) and a comparison circuit 124 (also referred to by the abbreviation "COMP" in the drawings). In some examples, the die 110 includes additional components that are not depicted in FIG. 1.

The input port 112 is electrically coupled with the input terminal 102, which is in turn electrically coupled with the test apparatus 180. The input port 112 receives a test pattern from the test apparatus 180 for conducting a test, in an embodiment. In some examples, the test pattern is generated by the test apparatus 180 or by a computer connected to the test apparatus 180 that executes an automatic test pattern generation (ATPG) program.

The input port 114 is electrically coupled with the input terminal 104, which is in turn electrically coupled with the test apparatus 180. The input port 114 receives a signature pattern from the test apparatus 180. In some examples, the signature pattern is generated by the test apparatus 180 or by a computer connected to the test apparatus 180 that executes a circuit simulation or circuit verification program defining a benchmark test output pattern that the set of interconnected circuit elements 122 should generate in response to the received teat pattern.

The input port 116 is electrically coupled with the input terminal 106, which is in turn electrically coupled with the test apparatus 180. The input port 116 receives a mask pattern from the test apparatus 180. In some examples, the mask pattern is generated along with the signature pattern by executing the circuit simulation or circuit verification program in order to indicate which bit or bits in the signature pattern are to be ignored when determining the pass or fail of the test. In some examples, the mask pattern further indicates to which scan chain in the set of interconnected circuit elements 122 the mask pattern is applicable.

The output port 118 is electrically coupled with the output terminal 108, which is in turn electrically coupled with the test apparatus 180. The output port 118 outputs a test result of the test from the die 110 to the test apparatus 180, the test result being indicative for example of a pass/fail determined on the die of a test in response to a received pattern.

In some examples, any port of the input ports 112, 114, and 116 and the output port 118 corresponds to one or more physical conductive lines or conductive pads on the die 110. In some examples, any port of the input ports 112, 114, and 116 and the output port 118 functions as an input port (e.g., receiving input signals) or as an output port (e.g., transmitting output signals) for other application not described in the present disclosure. In some examples, one or more of the input ports 112, 114, and 116 and the output port 118 are virtual input/output ports that share the same set of physical conductive lines or conductive pads on the die 110.

The set of interconnected circuit elements 122 receives the test pattern from the input port 112 through a set of electrical paths 132, generate a test output pattern in response to the test pattern, and output the test output pattern to the comparison circuit 124 through a set of electrical paths 142. In some examples, the set of interconnected circuit elements 122 includes a combination logic circuit. In some examples, the set of interconnected circuit elements 122 includes logic circuit elements, such as logic gates; analog circuit elements, such as amplifiers, buffers, analog-to-digital converters, or digital-to-analog converters; passive circuit elements, such as resistors and capacitors; or the like.

The comparison circuit 124 also includes interconnected circuit elements. In some examples, the comparison circuit 124 is implemented by a combination logic circuit. The comparison circuit 124 receives the signature pattern from the input port 114 through a set of electrical paths 134, receive the test output pattern from the set of interconnected circuit elements 122, compare the test output pattern and the signature pattern, and generate a die-level test result based on a comparison result of the test output pattern and the signature pattern. In some examples, the comparison circuit 124 outputs the die-level test result to the test apparatus 180 through a set of electrical paths 136, the output port 118, and the output terminal 108.

In some examples, the comparison circuit 124 receives a mask pattern from input port 116 through a set of electrical paths 136 and generates the die-level test result based on the mask pattern. In some examples, comparison circuit 124 sets any comparison result corresponding to the bits as indicated by the mask pattern as a "pass" result or a "do-not-care" result. In some examples, the comparison circuit 124 does not receive or use a mask pattern from the test apparatus 180, and various components corresponding to the input terminal 106 and the input port 116 are omitted.

Figure 2:
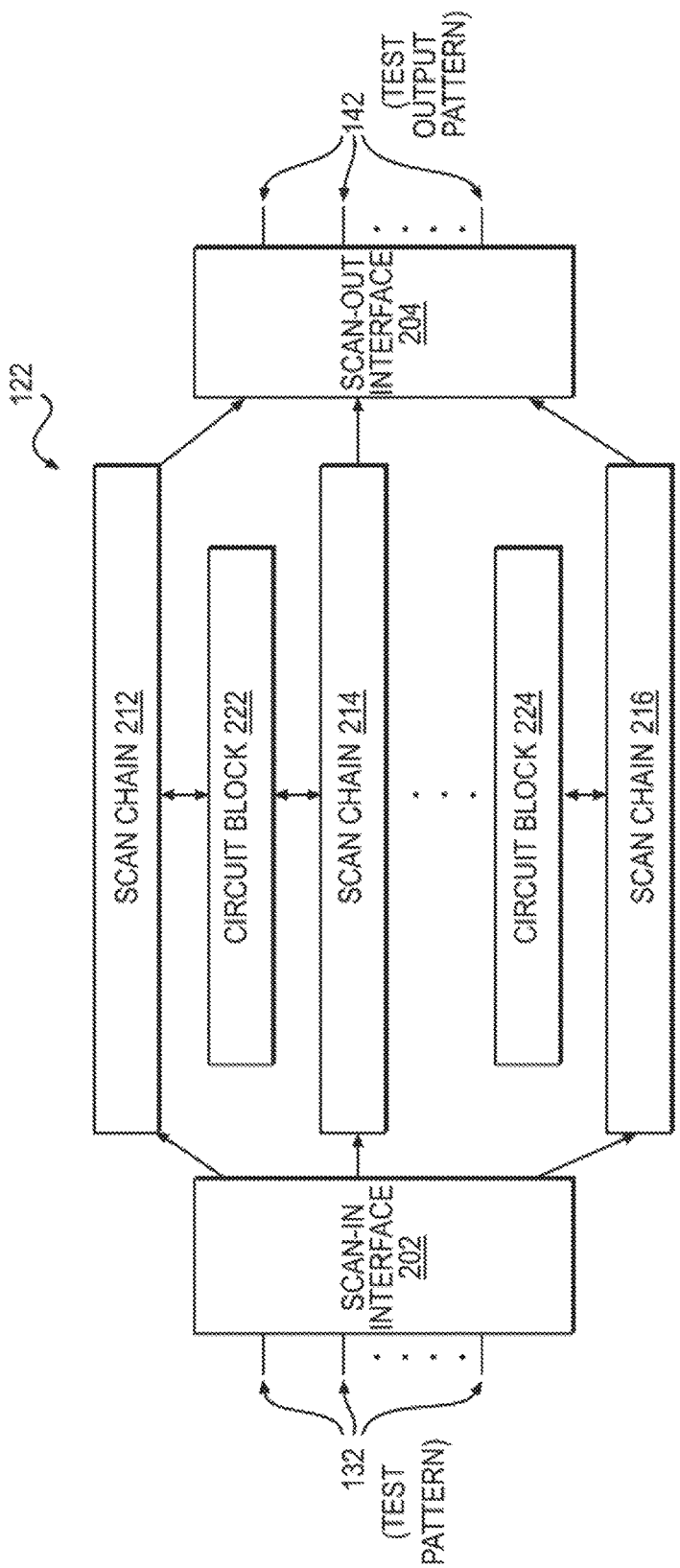
FIG. 2 shows a block diagram of a set of interconnected circuit elements in a die of an IC package, such as the set of interconnected circuit elements in FIG. 1, according to an embodiment of the disclosure.

FIG. 2 shows a block diagram of a set of interconnected circuit elements 122 in a die of an IC package according to an embodiment of the disclosure. Components in FIG. 2 that are the same or similar to the components in FIG. 1 are given the same reference numbers, and detailed description thereof with reference to FIG. 2 is omitted.

The set of interconnected circuit elements 122 includes a scan-in interface 202, a scan-out interface 204, a plurality of scan chains 212, 214, and 216, and a plurality of circuit blocks 222 and 224. The scan-in interface 202 receives a test pattern from signal path 132, which is to be transmitted multiple bits a time via corresponding signal lines. In some examples, the signal path 132 includes only one signal line, and the test pattern is transmitted one bit at a time via the single signal line. In some examples, the test pattern as received by the scan-in interface 202 is compressed or encoded. Therefore, the scan-in interface 202 is further configured to decompress and/or decode the test pattern and push the test pattern to the corresponding flip-flops in the scan chains 212, 214, and 216.

The scan-out interface 204 extracts a test output pattern from the scan chains 212, 214, and 216 and outputs the test output pattern to the signal path 142, which is also to be transmitted multiple bits a time via corresponding signal lines. In some examples, the signal path 142 includes only one signal line, and the test output pattern is transmitted one bit at a time via the single signal line. In some examples, the test output pattern is compressed or encoded for transmission. Therefore, the scan-out interface 204 is further configured to compress and/or encode the test output pattern before transmitting the test output pattern through the signal path 142.

Each scan chain of the scan chains 212, 214, and 216 includes a plurality of flip-flops or other types of memory elements, in an embodiment. The flip-flops or memory elements in a scan chain 212, 214, or 216 are serially connected as a shift register in a test mode, and the respective serial connections of the test mode are electrically decoupled in an operation mode. The flip-flops or memory elements of the scan chains 212, 214, and 216 are disposed at various nodes of the circuit blocks 222 and 224 where a starting state for a test will be applied and an end state for the test will be recorded.

At the test mode before executing a test, a predetermined starting state at various nodes when the test begins is provided through the scan chains 212, 214, and 216. Then the circuit blocks 222 and 224 operate a predetermined number of clock cycles based on the predetermined starting state at the various nodes and update the values at the various nodes as the circuit blocks 222 and 224 operate. At the test mode after executing the test, the end state at the various nodes are extracted as the test output pattern through the scan chains 212, 214, and 216.

The number of scan chains 212, 214, and 216 and circuit blocks 222 and 224 are illustrated as a non-limiting example. In some examples, the set of interconnected circuit elements 122 includes more or less than three scan chains and/or more or less than two circuit blocks 222 and 224.

Figure 3A:
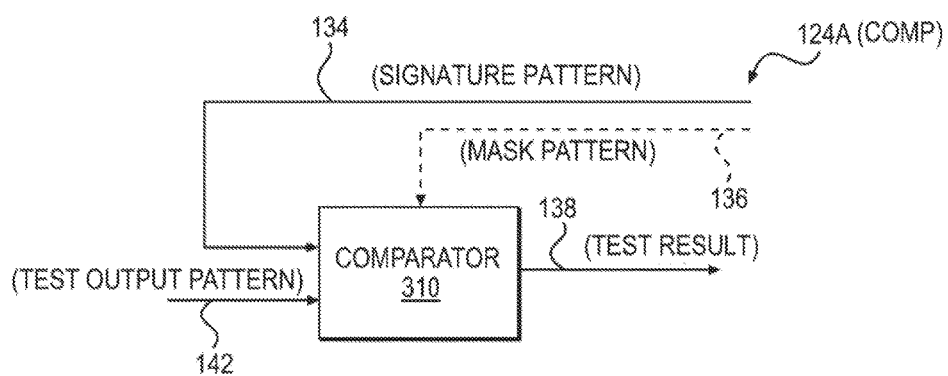
FIG. 3A shows a block diagram of a comparison circuit example, such as the comparison circuit in FIG. 1, according to an embodiment of the disclosure.

FIG. 3A shows a block diagram of a comparison circuit example 124A according to an embodiment of the disclosure. In some examples, the comparison circuit 124A corresponds to the comparison circuit 124 in FIG. 1. Components in FIG. 3A that are the same or similar to the components in FIG. 1 are given the same reference numbers, and detailed description thereof is omitted.

The comparison circuit 124A includes a comparator 310, which is a digital comparator in an embodiment and that merely for the sake of simplicity is referred to herein as a digital comparator, that is configured to receive the test output pattern from the set of circuit elements 122 through a set of electrically paths 142 and to receive the signature pattern from input port 114 (FIG. 1) through a set of electrical paths 134. The digital comparator 310 generates a die-level test result and output the die-level test result to output port 118 (FIG. 1) through a set of electrical paths 138.

In some examples, the set of electrically paths 142 has N signal lines, and the set of electrically paths 134 also has N signal lines, where N is a positive integer greater than one. In some examples, the signature pattern is provided in synchrony with the corresponding scan-out cycles of the test output pattern. In some examples, the digital comparator 310 is an N-bit comparator that compares the test output pattern and the signature pattern and generates a single bit comparison result on a cycle-by-cycle basis, and the set of electrical paths 138 includes only one signal line. In some examples, each cycle the digital comparator 310 outputs a first logical value as the die-level test result, such as a logical high, when the N-bit value of the of the test output pattern equals the N-bit value of the signature pattern; and output a second logical value, such as a logical low, when at least one bit of the of the test output pattern is different from the corresponding bit of the signature pattern.

In some examples, the digital comparator 310 includes N single-bit comparators, and each one of the single-bit comparators compares a respective bit of the test output pattern and a respective bit of the signature pattern and generates a corresponding comparison result on a cycle-by-cycle basis. In such scenario, the set of electrical paths 138 includes N signal lines corresponding to N bits of comparison results from the N single-bit comparators.

In some examples, the comparison circuit 124A receives a mask pattern from input port 116 (FIG. 1) through a set of electrical paths 136. In some examples, when the set of electrical paths 134 has N signal lines, the set of electrical paths 138 includes N signal lines each carrying a mask signal corresponding to a respective one of the N signal lines of the electrically paths 134. In such scenario, the digital comparator 310 is configured to force an equal result (i.e., a "pass" result) or ignore an unequal result (i.e., a "do-not-care" result) for respective bits when the corresponding mask signals have the logical high value; and to acknowledge an actual comparison result of the respective bits of the test output pattern and the signature pattern when the corresponding mask signal has the logical low value. In some examples, the mask signals are compressed or coded such that the N mask signals are transmitted by less than N signal lines. In such scenario, the digital comparator 310 is further configured to decode the received mask signals from the electrically paths 136 before applying the mask signals to the comparison of the test output pattern and the signature pattern.

Figure 3B:
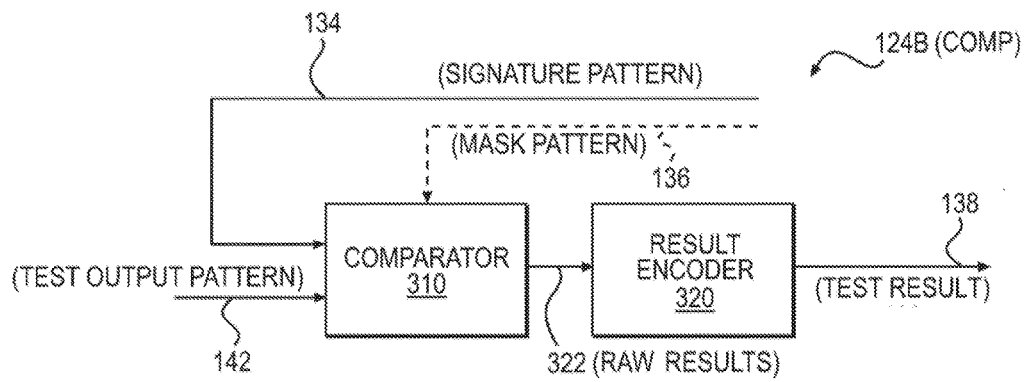
FIG. 3B shows a block diagram of another comparison circuit example, such as the comparison circuit in FIG. 1, according to an embodiment of the disclosure.

FIG. 3B shows a block diagram of another comparison circuit example 124B according to an embodiment of the disclosure. In some examples, the comparison circuit 124B corresponds to the comparison circuit 124 in FIG. 1. Components in FIG. 3B that are the same or similar to the components in FIG. 1 or in FIG. 3A are given the same reference numbers, and detailed description thereof is omitted.

The comparison circuit 124B includes a digital comparator 310 and a result encoder 320. In some examples, the digital comparator 310 includes N single-bit comparators and outputs N bits of raw comparison results to the result encoder 320 through electrical paths 322. The result encoder 320 analyzes the raw comparison results from the digital comparator 310, generates a die-level test result based on the raw comparison results, and outputs the die-level test result through the set of electrical paths 138. In such scenario, the die-level test result is in the form of a single-bit or a multiple-bit digital signal. In some examples, the die-level test result includes information regarding which bit of the test output pattern fails to match the corresponding bit of the signature pattern, other details, statistic information, and/or the like derived based on at least the raw comparison results. As such, the die-level test result not only provides the pass/fail information regarding a current test but is also usable for debugging the die under test.

The number of bits N illustrated above is a positive integer. In some examples, the number N ranges from 4-16. In some examples, the number N is 1.

Figure 4:
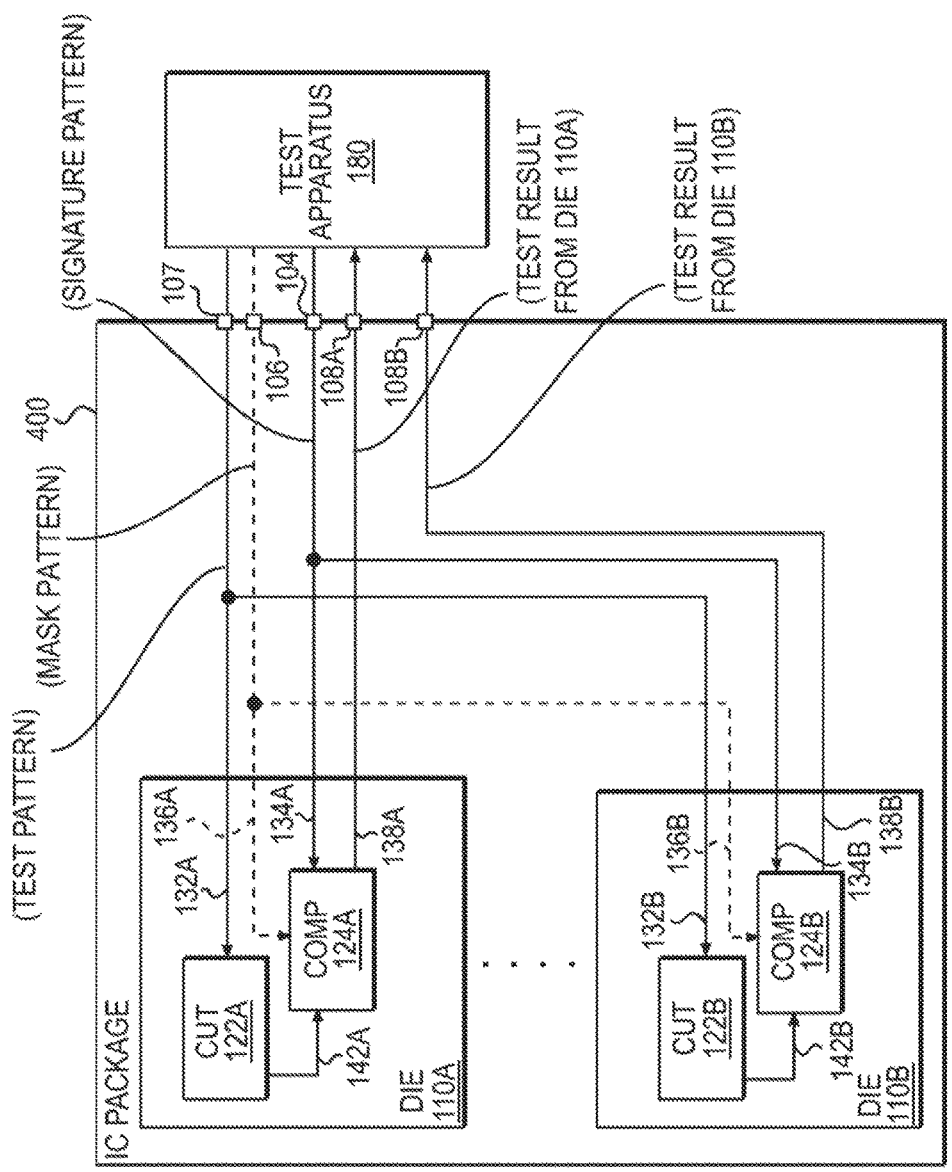
FIG. 4 shows a block diagram of another IC package example and a test apparatus example according to an embodiment of the disclosure.

FIG. 4 shows a block diagram of another IC package example 400 and a test apparatus example 180 according to an embodiment of the disclosure. The test apparatus 180 is external to the IC package 400. Components in FIG. 4 that are the same or similar to the components in FIG. 1 are given the same reference numbers or the same reference numbers followed by various identifiers such as 'A' or '13', and detailed description thereof are omitted.

The IC package 400 includes a plurality of dies 110A and 110B encapsulated therein. The dies 110A and 110B correspond to the die 110 in FIG. 1. In some examples, the die 110B is a duplicate of the die 110A and thus the dies 110A and 110B have a same circuit configuration. In some examples, the die 110A and the die 110B have different circuit configurations. In some examples, there are more than two dies encapsulated in the IC package 400.

In some examples, the test apparatus 180 broadcasts a test pattern to the die 110A and a test pattern to the die 110B through the input terminal 102. In some examples, the test patterns used by the dies 110A and 110B in a given test are the same, and the dies 110A and 110B receive the broadcasted test pattern through the input terminal 102 as is. In some examples, the test patterns used by the dies 110A and 110B in a given test are different, and the dies 110A and 110B extract the applicable test patterns from the broadcasted signals received through the input terminal 102. In some examples, the test apparatus 180 transmits test patterns to the die 110A and to the die 110B through different pins of the input terminal 102.

In some examples, the test apparatus 180 broadcasts a signature pattern to the die 110A and a signature pattern to the die 110B through input terminal 104. In some examples, the signature patterns used by the dies 110A and 110B in a given test are the same, and the dies 110A and 110B receive the broadcasted signature pattern through the input terminal 104 as is. In some examples, the signature patterns used by the dies 110A and 110B in a given test are different, and the dies 110A and 110B extract the applicable signature patterns from the broadcasted signals received through the input terminal 104. In some examples, the test apparatus 180 transmits signature patterns to the die 110A and the die 110B through different pins of the input terminal 104.

In some examples, the test apparatus 180 also broadcasts a mask pattern to the die 110A and a mask pattern to the die 110B through input terminal 106. In some examples, the mask patterns used by the dies 110A and 110B in a given test are the same, and the dies 110A and 110B receive the broadcasted mask pattern through the input terminal 106 as is. In some examples, the mask patterns used by the dies 110A and 110B in a given test are different, and the dies 110A and 110B extract the applicable mask patterns from the broadcasted signals received through the input terminal 106. In some examples, the test apparatus 180 transmits mask patterns to the die 110A and the die 110B through different pins of the input terminal 106. In some examples, one or all of the dies do not need the mask patterns, and the set of signal paths 136A, the set of signal paths 136B, or the input terminal 106 is thus omitted.

The die 110A includes a set of interconnected circuit elements 122A and a comparison circuit 124A. The set of interconnected circuit elements 122A receives the test pattern through the set of signal paths 132A, generates a test output pattern in response to the test pattern, and outputs the test output pattern to the comparison circuit 124A through a set of electrical paths 142A. The comparison circuit 124A receives the signature pattern through the set of signal paths 136A, receives the test output pattern from the set of interconnected circuit elements 122A, compares the test output pattern and the signature pattern, and generates a die-level test result based on a comparison result of the test output pattern and the signature pattern. In some examples, the comparison circuit 124A further receives the mask pattern through the set of signal paths 136A and generates the die-level test result consistent with the "pass" result or the "do-not-care" result indicated by the mask pattern. The comparison circuit 124A outputs the die-level test result to the test apparatus 180 through the output terminal 108A.

The die 110B also includes a set of interconnected circuit elements 122B and a comparison circuit 124B. The set of interconnected circuit elements 122B receives the test pattern through the set of signal paths 132B, generates a test output pattern in response to the test pattern, and outputs the test output pattern to the comparison circuit 124B through a set of electrical paths 142B. The comparison circuit 124B receives the signature pattern through the set of signal paths 136B, receives the test output pattern from the set of interconnected circuit elements 122B, compares the test output pattern and the signature pattern, and generate a die-level test result based on a comparison result of the test output pattern and the signature pattern. In some examples, the comparison circuit 124B further receives the mask pattern through the set of signal paths 136B and generates the die-level test result consistent with the "pass" result or the "do-not-care" result indicated by the mask pattern. The comparison circuit 124B outputs the die-level test result to the test apparatus 180 through the output terminal 108B.

Figure 5:
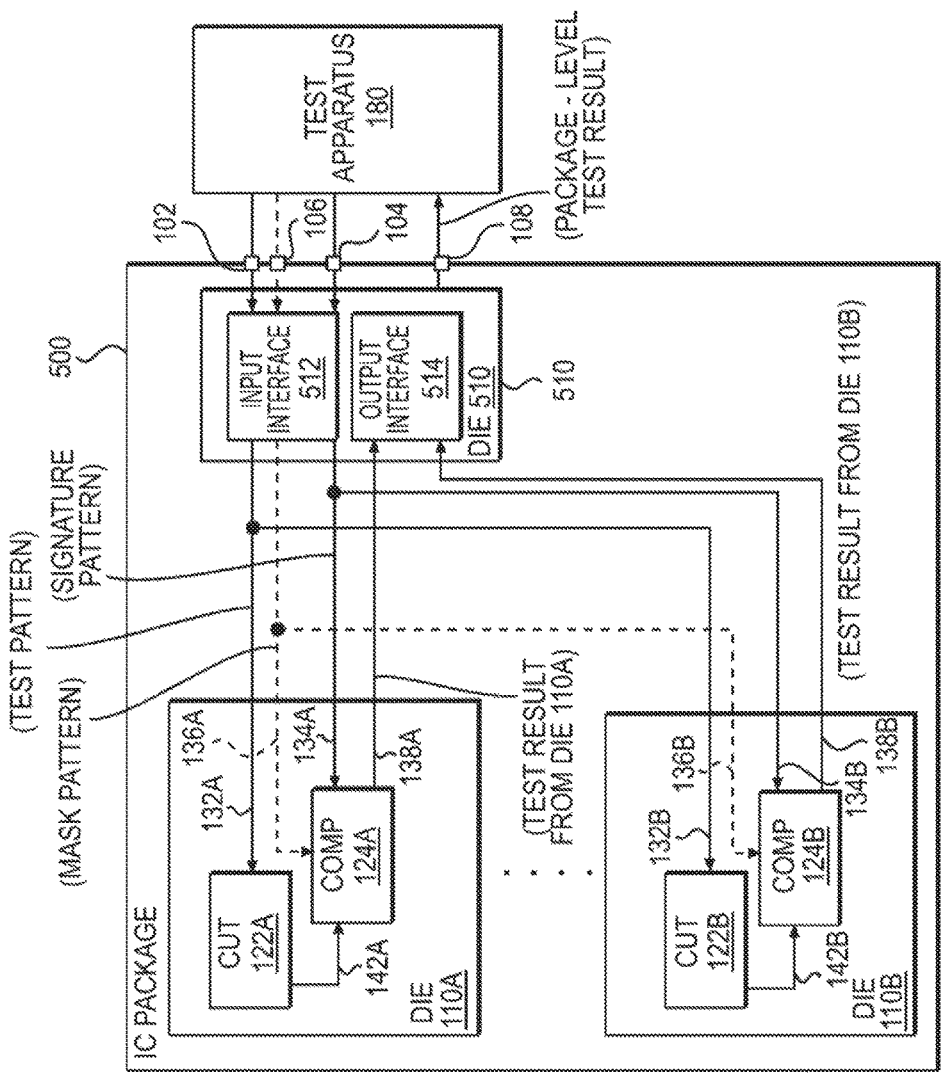
FIG. 5 shows a block diagram of another IC package example and a test apparatus example according to an embodiment of the disclosure.

FIG. 5 shows a block diagram of another IC package example 500 and a test apparatus example 180 according to an embodiment of the disclosure. The test apparatus 180 is external to the IC package 500. Components in FIG. 5 that are the same or similar to the components in FIG. 1 or FIG.

4 are given the same reference numbers, and detailed description thereof is omitted.

The IC package 500 includes a plurality of dies 110A and 110B encapsulated therein. The IC package 500 further includes another die 510 encapsulated therein. The die 510 includes an input interface circuit 512 and an output interface circuit 514 for testing the dies 110A and 110B. In some examples, the die 510 includes other functional circuits. In some examples, the die 510 further includes circuit elements that correspond to the set of circuit elements 122 and/or the comparison circuit 124.

The input interface circuit 512 receives, from the test apparatus 180 to be used by the dies 110A and 110B, the test patterns through the input terminal 102, the signature patterns through the input terminal 104, and in some examples the mask patterns through the input terminal 106. The input interface circuit 512 decodes or extracts test patterns, signature patterns, and/or mask patterns from the received signals from the test apparatus 180 and transmits the extracted patterns to the dies 110A and 110B through respective sets of signal paths. In some examples, the input interface circuit 512 simply relays the received signals from the test apparatus to the dies 110A and 110B.

The output interface circuit 514 receives, from the dies 110A and 110B, the corresponding die-level test results. The output interface circuit 514 generates a package-level test result based on the die-level test results from the dies 110A and 110B and outputs the package-level test result to the test apparatus 180 through the output terminal 108. In some examples, the output interface circuit 514 simply relays the received die-level test results from the dies 110A and 110B to the test apparatus 180 as the package-level test result.

Figure 6:
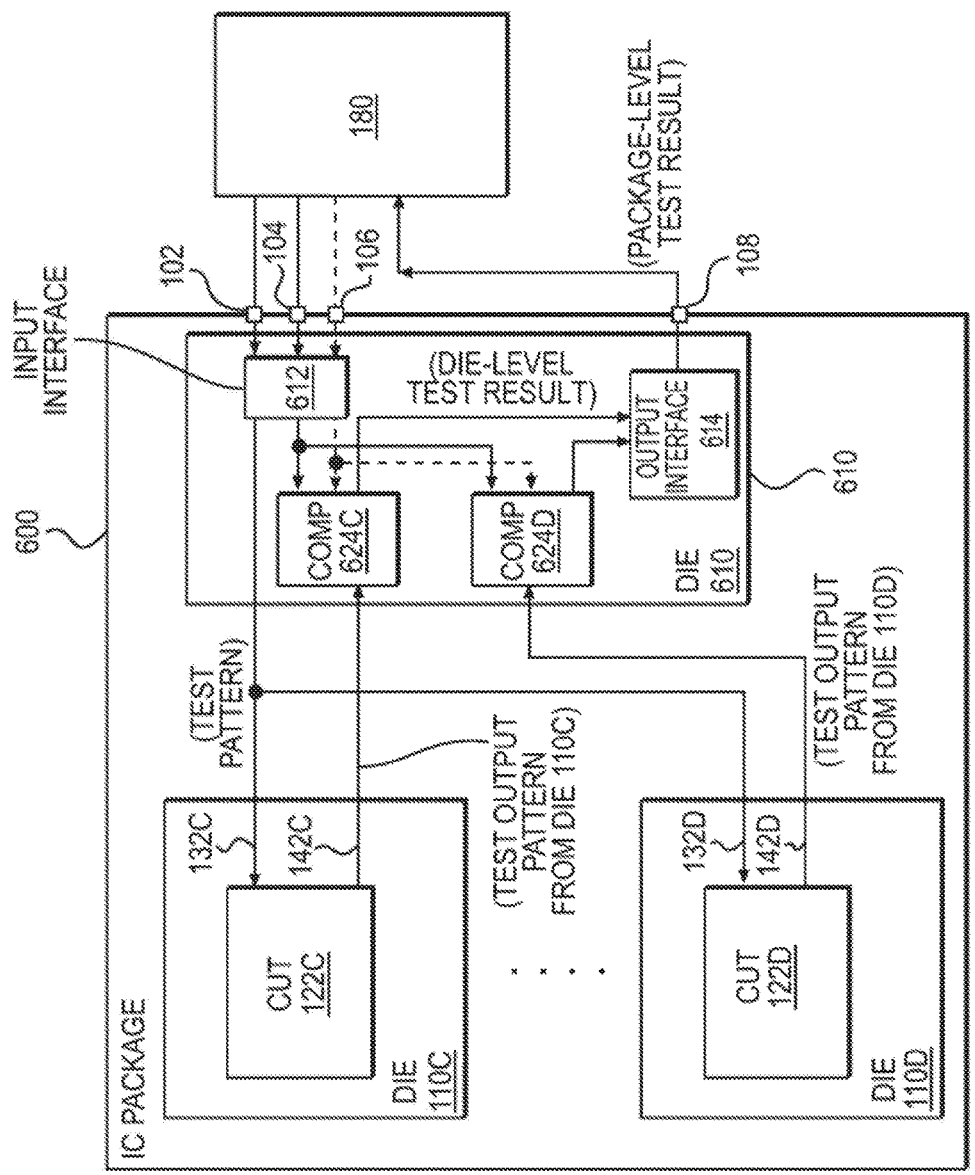
FIG. 6 shows a block diagram of another IC package example and a test apparatus example according to an embodiment of the disclosure.

FIG. 6 shows a block diagram of another IC package example 600 and a test apparatus example 180 according to an embodiment of the disclosure. The test apparatus 180 is external to the IC package 600. Components in FIG. 6 that are the same or similar to the components in FIG. 1 are given the same reference numbers, and detailed description thereof is omitted.

The IC package 600 includes a plurality of dies 110C, 110D, and 610 encapsulated therein. The die 110C includes a set of interconnected circuit elements 122C that corresponds to the set of interconnected circuit elements 122 in FIG. 1. The die 110D includes a set of interconnected circuit elements 122D that also corresponds to the set of interconnected circuit elements 122 in FIG. 1. In some examples, the die 110D is a duplicate of the die 110C, and the dies 110C and 110D thus have a same circuit configuration. In some examples, the die 110C and the die 110D have different circuit configurations. In some examples, there are more than three dies encapsulated in the IC package 600. In some examples, one of the dies 110C and 110D is omitted.

The die 610 includes an input interface circuit 612, an output interface circuit 614, and comparison circuits 624C and 624D. The input interface circuit 612 and the output interface circuit 614 correspond to the input interface circuit 512 and the output interface circuit 514 in FIG. 5, respectively. The comparison circuits 624C and 624D correspond to the comparison circuit 124 in FIG. 1. In some examples, when one of the dies 110C and 110D is omitted, the corresponding comparison circuit 624C or 624D is omitted.

The input interface circuit 612 receives, from the test apparatus 180 to be used by the dies 110C and 110D, the test patterns through the input terminal 102, the signature patterns through the input terminal 104, and optionally the mask patterns through the input terminal 106. The input interface circuit 612 is further configured to decode or extract test patterns from the received signals from the test apparatus 180 and transmit the extracted patterns to the dies 110C and 110D through respective sets of signal paths 132C and 132D. In some examples, the input interface circuit 612 simply relays the received signals from the test apparatus to the dies 110C and 110D.

In the die 110C, the set of interconnected circuit elements 122C receives the test pattern through the set of signal paths 132C, generates a test output pattern in response to the test pattern, and outputs the test output pattern to the comparison circuit 624C in the die 610 through a set of electrical paths 142C. In the die 110D, the set of interconnected circuit elements 122D receives the test pattern through the set of signal paths 132D, generates a test output pattern in response to the test pattern, and outputs the test output pattern to the comparison circuit 624D in the die 610 through a set of electrical paths 142D.

In the die 610, the comparison circuit 624C receives the signature pattern from the input interface circuit 612, receives the test output pattern from the set of interconnected circuit elements 122C, compares the test output pattern and the signature pattern, generates a die-level test result for the die 110C based on a comparison result of the test output pattern and the signature pattern, and outputs the die-level test result for the die 110C to the output interface circuit 614. Also, the comparison circuit 624D receives the signature pattern from the input interface circuit 612, receives the test output pattern from the set of interconnected circuit elements 122D, compares the test output pattern and the signature pattern, generates a die-level test result for the die 110C based on a comparison result of the test output pattern and the signature pattern, and outputs the die-level test result for the die 110C to the output interface circuit 614.

The output interface circuit 614 generates a package-level test result based on the die-level test results from the comparison circuits 624C and 624D and outputs the package-level test result to the test apparatus 180 through the output terminal 108. In some examples, the output interface circuit 614 simply relays the received die-level test results to the test apparatus 180 as the package-level test result. In some examples, the comparison circuits 624C and 624D output the die-level test results as the package-level test result through the output terminal 108, and the output interface circuit 614 is thus omitted.

Various modifications and variations based on the IC package examples 100, 400, 500, and 600 are within the scope of the present disclosure.

Figure 7:
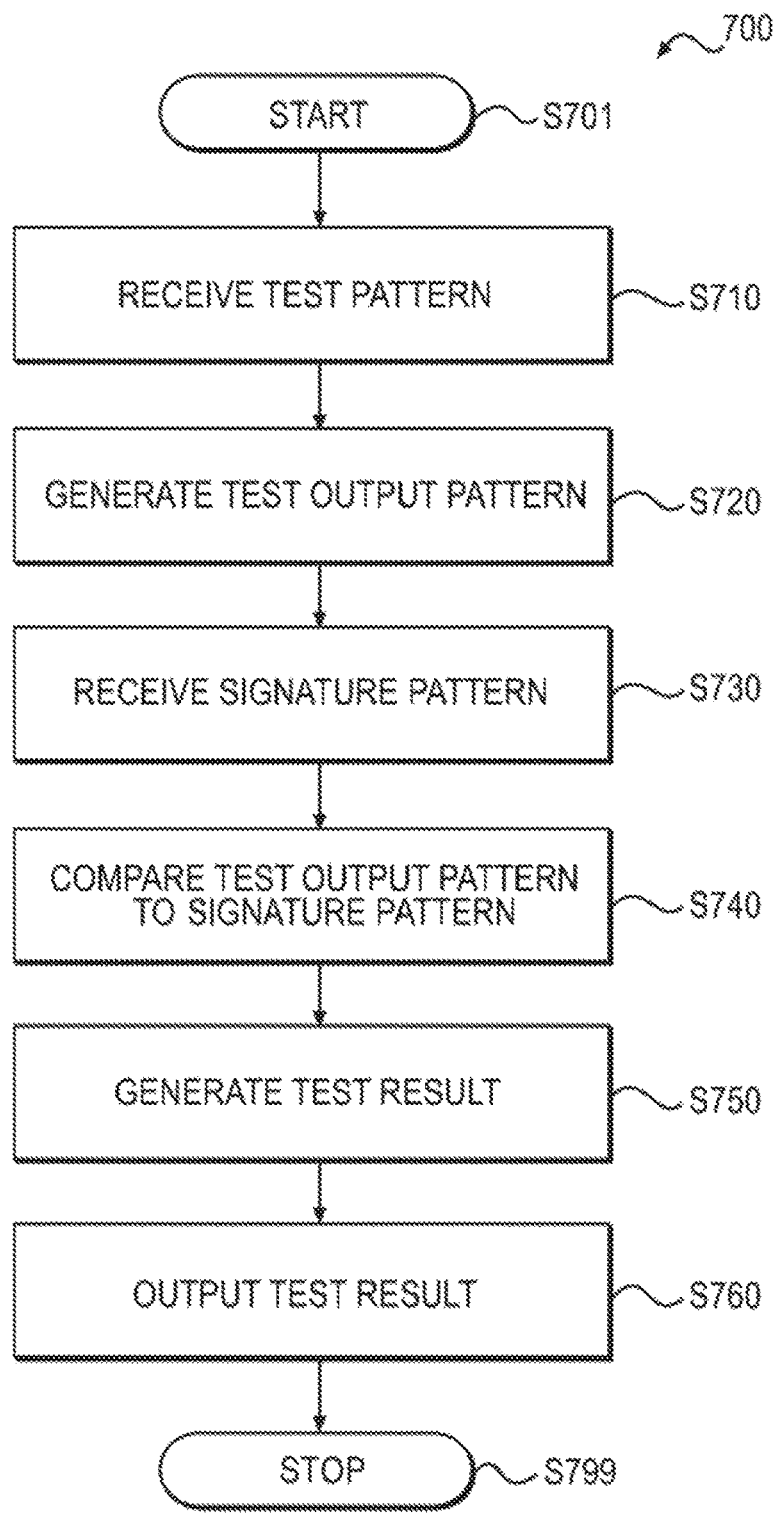
FIG. 7 shows a flow chart outlining a process example for testing an IC package, such as the IC packages in FIGS. 1 and 4-6, according to an embodiment of the disclosure.

FIG. 7 shows a flow chart outlining a process example 700 for testing an IC package according to an embodiment of the disclosure. In some examples, the process 700 is performed by the IC package 100, 400, 500, or 600 illustrated above. The process 700 starts at S701 and proceeds to S710.

At S710, a test pattern from a test apparatus that is external to the IC package is received by a die of the IC package. In some examples when there are two or more dies to be tested in the IC package, a first die receives a first test pattern and a second die receives a second test pattern from the test apparatus. In some examples, the test pattern is received by the die based on a scan-in technique when the die is set to a test mode.

For example, in FIG. 1, the die 110 of the IC package 100 receives a test pattern from the test apparatus 180. In FIG. 4, the die 110A and the die 110B of the IC package 400 receive corresponding test patterns from the test apparatus 180. In FIG. 5, the die 110A and the die 110B of the IC package 500 receive corresponding test patterns from the test apparatus 180 through another die 510 of the IC package 500. Also, in FIG. 6, the die 110C and the die 110D of the IC package 600 receive corresponding test patterns from the test apparatus 180 through another die 610 of the IC package 600.

At S720, a test output pattern is generated by the die of the IC package in response to the test pattern. In some examples, the test output pattern is generated by the die based on a predetermined scan-based test technique when the die is set to an operation mode. In some examples, the test output pattern is output by the die based on a scan-out technique when the die is set to a test mode.

For example, in FIG. 1, the set of interconnected circuit elements 122 of the die 110 receives the test pattern and generate a test output pattern in response to the received test pattern. In FIG. 4, the set of interconnected circuit elements 122A of the die 110A and the set of interconnected circuit elements 122B of the die 110B of the IC package 400 receive corresponding test patterns and generate corresponding test output patterns, respectively. In FIG. 5, the set of interconnected circuit elements 122A of the die 110A and the set of interconnected circuit elements 122B of the die 110B of the IC package 500 receive corresponding test patterns and generate corresponding test output patterns, respectively. Also, in FIG. 6, the set of interconnected circuit elements 122C of the die 110C and the set of interconnected circuit elements 122D of the die 110D of the IC package 600 receive corresponding test patterns and generate corresponding test output patterns, respectively.

At S730, a signature pattern from the test apparatus is received by the IC package. In some example, the signature pattern is received by the die under test. In some examples, the signature pattern is received by a die different from the die under test. In some examples, when there are two or more dies of the IC package are tested, a first signature pattern corresponding to a first die and a second signature pattern corresponding to a second die from the test apparatus are received by the IC package. In some examples, the signature pattern is received by the IC package based on transmission method similar to a scan-in technique when the die is set to a test mode. In some examples, a mask pattern from the test apparatus corresponding to the signature pattern is also received by the IC package.

For example, in FIG. 1, the comparison circuit 124 of the die 110 receives the signature pattern and in some examples a corresponding mask pattern from the test apparatus 180. In FIG. 4, the comparison circuit 124A of the die 110A and the comparison circuit 124B of the die 110B of the IC package 400 receives corresponding signature patterns or mask patterns from the test apparatus 180. In FIG. 5, the comparison circuit 124A of the die 110A and the comparison circuit 124B of the die 110B of the IC package 500 receive corresponding signature patterns or mask patterns from the test apparatus 180 through another die 510 of the IC package 500. Also, in FIG. 6, the comparison circuit 624C and the comparison circuit 624D of the die 610 of the IC package 600 receive corresponding test patterns from the test apparatus 180.

At S740, the test output pattern and the signature pattern are compared. In some examples, the test output pattern and the signature pattern are received based on a predetermined scan-in or scan-out cycle, and the comparison is performed on a cycle-by-cycle basis.

For example, in FIG. 1, the comparison circuit 124 of the die 110 compares the received signature pattern and the test output pattern from the set of interconnected circuit elements 122. In FIG. 4 and FIG. 5, the comparison circuit 124A of the die 110A compares the received signature pattern and the test output pattern from the set of interconnected circuit elements 122A; and the comparison circuit 124B of the die 110B compares the received signature pattern and the test output pattern from the set of interconnected circuit elements 122B. Also, in FIG. 6, the comparison circuit 624C of the die 610 compares the received signature pattern and the test output pattern from the set of interconnected circuit elements 122C; and the comparison circuit 624D of the die 610 compares the received signature pattern and the test output pattern from the set of interconnected circuit elements 122D.

At S750, a package-level test result is generated based on a comparison result of the test output pattern and the signature pattern. In some examples when the corresponding mask pattern is received, the package-level test result is generated further based on the mask pattern, which indicates the bits that would be indicated as a "pass" result or a "do-not-care" result regardless the actual comparison results.

For example, in FIG. 1, the comparison circuit 124 of the die 110 generates a die-level test result based on the comparison result of the corresponding test output pattern and signature pattern and use the die-level test result as the package-level test result for the IC package 100. In FIG. 4, the comparison circuit 124A of the die 110A generates a first die-level test result, the comparison circuit 124B of the die 110B generates a second die-level test result, and the IC package 400 uses the first and second die-level test results as the package-level test result. In FIG. 5, the comparison circuit 124A of the die 110A generates a first die-level test result, the comparison circuit 124B of the die 110B generates a second die-level test result, and the output interface circuit 514 of the die 510 generates a package-level test result for the IC package 500 based on the first and second die-level test results. Also, in FIG. 6, the comparison circuit 624C of the die 610 generates a first die-level test result, the comparison circuit 624D of the die 610 generates a second die-level test result, and the output interface circuit 614 of the die 610 generates a package-level test result for the IC package 600 based on the first and second die-level test results.

At S750, the package-level test result is output to the test apparatus external to the IC package. For example, in FIG. 1, the comparison circuit 124 of the die 110 outputs the die-level test result as the package-level test result to the test apparatus 180. In FIG. 4, the comparison circuit 124A of the die 110A outputs the first and second die-level test results as the package-level test result to the test apparatus 180. In FIG. 5, the output interface circuit 514 of the die 510 outputs the package-level test result to the test apparatus 180. Also, in FIG. 6, the output interface circuit 614 of the die 610 outputs the package-level test result to the test apparatus 180.

After S760, the process proceeds to S799 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit (IC) package, comprising:
   a first die including:

a first input port configured to receive a first test pattern from a test apparatus that is external to the IC package;

a second input port configured to receive a first signature pattern from the test apparatus the first signature pattern indicative of a first expected first test output pattern in response to the first test pattern;

a first set of interconnected circuit elements configured to:
  receive the first test pattern from the first input port, and
  generate a first test output pattern in response to the first test pattern being passed through the first set of interconnected circuit elements; and a first comparison circuit configured to:
  compare the first test output pattern and the first signature pattern, and
  generate a first die-level test result based on a comparison result of the first test output pattern to the first signature pattern;

a second die including:
  a third input port configured to receive a second test pattern from the test apparatus;
  a fourth input port configured to receive a second signature pattern from the test apparatus, the second signature pattern indicative of second expected test output pattern in response to the second test pattern;
  a second set of interconnected circuit elements configured to:
    receive the second test pattern from the third input port, and
    generate a second test output pattern in response to the second test pattern being passed through the second set of interconnected circuit elements; and
  a second comparison circuit configured to:
    compare the second test output pattern and the second signature pattern, and
    generate a second die-level test result based on a comparison result of the second test output pattern to the second signature pattern; and a third die configured to:
  receive the first die-level test result from the first die,
  receive the second die-level test result from the second die,
  generate a package-level test result based on a combination of the first die-level test result and the second die-level test result, and
  output the package-level test result to the test apparatus.

2. The IC of claim 1, wherein the first input port and the second input port are a same port.

3. The IC of claim 1, wherein the first input port and the second input port are different ports.

4. The IC of claim 1, wherein the third input port and the fourth input port are a same port.

5. The IC of claim 1, wherein the third input port and the fourth input port are different ports.

6. The IC package of claim 1, wherein the first die and the second die have a same circuit configuration.

7. The IC package of claim 1, wherein
the first comparison circuit is further configured to output the first die-level test result to the test apparatus, and
the second comparison circuit is further configured to output the second die-level test result to the test apparatus.

8. The IC package of claim 1, wherein the first comparison circuit is further configured to:
receive a first mask pattern indicating a portion of the comparison result of the first test output pattern to the first signature pattern to be set as a pass result or a do-not-care result, and
generate the comparison result of the first test output pattern to the first signature pattern consistent with the pass result or the do-not-care result indicated by the mask pattern the first mask pattern.

9. The IC package of claim 1, wherein the second die is further configured to:
receive the first die-level test result from the first die,
generate a package-level test result based on at least the first die-level test result, and
output the package-level test result to the test apparatus.

* * * * *